United States Patent [19]

Jung

[11] Patent Number: 5,233,429
[45] Date of Patent: Aug. 3, 1993

[54] CCD IMAGE SENSOR HAVING IMPROVED STRUCTURE OF VCCD REGION THEREOF

[75] Inventor: Hun J. Jung, Kyungki, Rep. of Korea

[73] Assignee: Gold Star Electron Co. Ltd., Chungcheongbuk, Rep. of Korea

[21] Appl. No.: 775,306

[22] Filed: Oct. 11, 1991

[30] Foreign Application Priority Data

Oct. 13, 1990 [KR] Rep. of Korea .......................... 16295

[51] Int. Cl.$^5$ ........................ H04N 3/14; H04N 5/335
[52] U.S. Cl. ........................ 358/213.23; 358/213.19; 257/220; 257/223
[58] Field of Search ........................ 358/213.23, 213.19, 358/213.31, 213.15; 357/24 LR, 30 H

[56] References Cited

U.S. PATENT DOCUMENTS

| | | | |
|---|---|---|---|
| 4,626,915 | 12/1986 | Takatsu | 358/213.19 |
| 4,688,098 | 8/1987 | Kon et al. | 358/213.19 |
| 4,814,848 | 3/1989 | Akimoto et al. | 357/24 L |
| 4,875,100 | 10/1989 | Yonemoto et al. | 358/213.19 |
| 4,954,895 | 9/1990 | Akimoto et al. | 357/24 L |
| 4,977,584 | 12/1990 | Kohno et al. | 358/213.19 |

OTHER PUBLICATIONS

Horii, et al., IEEE Transactions on Electron Devices, vol. ED-32, No. 8, Aug., 1985, pp. 1446-1450.

*Primary Examiner*—Michael T. Razavi
*Assistant Examiner*—Wendy R. Grenning
*Attorney, Agent, or Firm*—Faegre & Benson

[57] ABSTRACT

A CCD image sensor having an N type photodetecting region, an N type VCCD region and an N type HCCD region, comprising a P type layer formed underneath and surrounding said N type VCCD region, an N type layer formed underneath and surrounding said P type layer, a P type well formed underneath and surrounding said N type layer, and an N type substrate formed under said P type well, said substrate being adapted and arranged for the application thereto of a shutter voltage. In accordance with the present invention, the CCD image sensor is capable of preventing an overflow drain caused by error charges or excess charges resulting from a smear. Therefore, the photoelectric efficiency can be increased in a wavelength of the red color type wherein the amount of light energy is small.

12 Claims, 3 Drawing Sheets

CCD IMAGE SENSOR HAVING IMPROVED STRUCTURE OF VCCD REGION THEREOF

BACKGROUND OF THE INVENTION

1. Field of the Invention

The present invention relates in general to a charge coupled device (hereinafter referred to as a CCD) image sensor, and more particularly to a CCD image sensor having an improved structure of a vertical charge coupled device (hereinafter referred to as a VCCD) region thereof.

2. Description of the Prior Art

A solid state image scanner is generally formed by disposing a plurality of photodetectors and a plurality of photoscanners on a substrate of a semi-conductor material, such as silicon oxide. Elements may be selected for the photodetectors in order to establish an image pickup from the visible range to the infrared range.

For example, the solid state image scanner may include an MOS switch, a CCD, etc. The CCD is comprised of a vertical charge coupled device (VCCD) region and a horizontal charge coupled device (hereinafter referred to as an HCCD) region.

A CCD image sensor utilizing CCDs typically converts light energy through the photodetector into an electric signal, with the photoelectric efficiency being very low in a wavelength of a red color type, wherein the amount of light energy is small. That is, image signal charges of the red color type are not transferred fully to the VCCD region, resulting in difficulty in providing a perfect picture.

With reference to FIG. 1 there is shown a schematic diagram of a construction of a conventional CCD image sensor of an interline transfer type. As shown in this figure, a conventional CCD image sensor comprises an N type horizontal charge coupled device (HCCD) region 3 and a plurality of N type vertical charge coupled device (VCCD) regions 2, to each of which a series of N type photodiodes 1 are connected in a one to one relationship. Each of the N type photodiodes 1 is connected to the N type VCCD region 2, such that an image signal charge output from the N type photodiodes 1 is transferred to the N type VCCD region 2 in a single direction. Also, the N type VCCD regions 2 are connected to the N type HCCD region 3, such that the signal charges transferred from the photodiodes 1 are transferred to the N type HCCD region 3 simultaneously in response to predetermined clock signals. To the output of the N type HCCD region 3 is connected a sensing amplifier 4 for sensing states of the signal charges and amplifying the sensed states of the signal charges by a predetermined amplification degree.

With reference to FIG. 2, there is shown a sectional view, taken on the line a—a' of FIG. 1. As shown in this figure, on an N type substrate 5 is formed a P type well 6, on which is formed the N type photodiode 1 being spaced apart at a desired interval from the N type VCCD region 2. A transfer gate electrode 7 is formed on the upper side of and between the N type photodiode 1 and the N type VCCD region 2, and a gate electrode 8 is formed on the N type VCCD region 2. As illustrated in FIG. 2, a P+ type ion layer 9 is formed underneath and surrounding the N type VCCD region 2.

The P+ type ion layer 9 is adapted to prevent noises, such as a blooming, occurring when excess electronic signal charges resulting from a smear are transferred to the N type VCCD region 2.

Also, on the surface of the N type photodiode 1 is formed a thin P+ type ion layer 10 for applying an initial bias to the surface.

Preferably, materials of the transfer gate electrode 7 and the gate electrode 8 may be polysilicons. Although not shown, insulating films are formed between the transfer gate electrode 7, the gate electrode 8 and the surface of the P type well 6. This technique is shown in pages 1448, 1451, 1458 and 1498 of "Transactions on Electron Devices" published by IEEE, August, 1985.

With reference to FIG. 3, there is shown a potential profile diagram, taken on the line b—b' of FIG. 2, illustrating a vertical potential distribution under the condition that the charges e are contained in the N type VCCD region 2.

The image signal charges e are moved from the N type photodiodes 1 to the N type VCCD region 2, upon application of a high voltage to the transfer gate electrode 7. At this time, the $P^{30}$ type ion layer 9 formed between the N type VCCD region 2 and the P type well 6 prevents the P type well from being fully depleted, resulting in a higher potential barrier. As a result, the excess charges resulting from a smear are not moved to the N type VCCD region 2.

With reference to FIG. 4, there is shown a potential profile diagram, taken on the line c—c' of FIG. 2, illustrating a state in which the P type well 6 is fully depleted due to physical properties of the PN junction upon the application of a high voltage to the N type substrate 5, resulting in a lower potential barrier.

If strong light energy is transmitted to the N type photodiode 1, such that the signal charges produced from the N type photodiode 1 are too great, excess charges e' are transferred to the N type substrate 5 over the P type well 6. Here, the depth of the P type well 6 between the N type photodiode 1 and the N type substrate 5 is shallow, so that the excess charges e' are not moved to the N type VCCD region 2, but are readily absorbed into the P type well 6. Thus, the P type well is adapted to prevent an overflow drain (OFD). To achieve this effect, the portion of the N type substrate 5 under the N type photodiode 1 may be formed higher than others and the portion of the N type photodiode 1 may be formed deeper. At this time, since a desired potential barrier resulting from the P+ type ion layer 9 is formed in the N type VCCD region 2, as shown in FIG. 3, the excess charges e' from the N type photodiode 1 are not transferred to the N type VCCD region 2.

However, this conventional CCD image sensor has disadvantages as follow:

First, although the P+ type ion layer 9 formed underneath and surrounding the N type VCCD region 2, as shown in FIG. 2, has an effect of preventing a blooming resulting from a smear to a degree, the excess charges cannot be moved fully to the N type substrate 5, thereby causing the excess charges to be moved to the N type VCCD region of another cell, resulting in the blooming.

Second, because the P type well 6 is formed shallow in the portion between the N type photodiode 1 and the N type substrate 5 for ease of absorption of the excess charges e', the image signal charges of the red color type of long wavelength are not transferred fully to the N type VCCD region 2, but are partially absorbed into the N type substrate 5.

Third, it is difficult to provide a substrate which is etched in part in order to meet the above conditions.

SUMMARY OF THE INVENTION

Therefore, the present invention has been made in view of the above problems, and it is an object of the present invention to provide a CCD image sensor having an improved structure of a vertical charge coupled device (VCCD) region thereof, which is capable of preventing an overflow drain caused by error charges or excess charges resulting from a smear.

In accordance with the present invention, the above object can be accomplished by providing a CCD image sensor having an N type photodetecting region, an N type VCCD region and an N type HCCD region, comprising: a P type layer formed underneath and surrounding said N type VCCD region; an N type layer formed underneath and surrounding said P type layer; a P type well formed underneath and surrounding said N type layer; and an N type substrate formed under said P type well, said substrate being adapted and designed for application thereto of a shutter voltage.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

First, a construction of a CCD image sensor of the present invention will be described with reference to FIG. 5.

Figure 5:
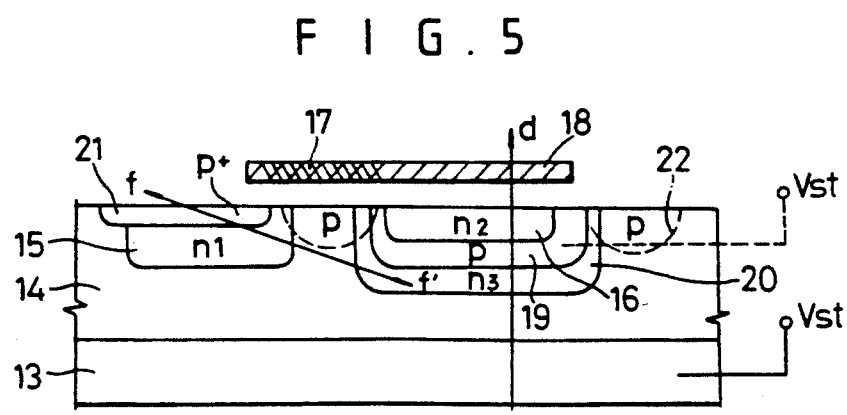
FIG. 5 is a sectional view of a CCD image sensor of the present invention.

With reference to FIG. 5, there is shown a sectional view of a CCD image sensor of the present invention. As shown in this drawing, on an N type substrate 13 is formed a P type well 14, on which are formed an N type photodiode 15 and an N type VCCD region 16, these being spaced apart at a desired interval from each other. A transfer gate electrode 17 is formed on the upper side of and between the N type photodiode 15 and the N type VCCD region 16 and a gate electrode 18 is formed on the N type VCCD region 16. A P type ion layer 19 is formed underneath and surrounding the N type VCCD region 16. Also, N type ion layer 20 is formed underneath and surrounding the P type ion layer 19.

Figure 1:
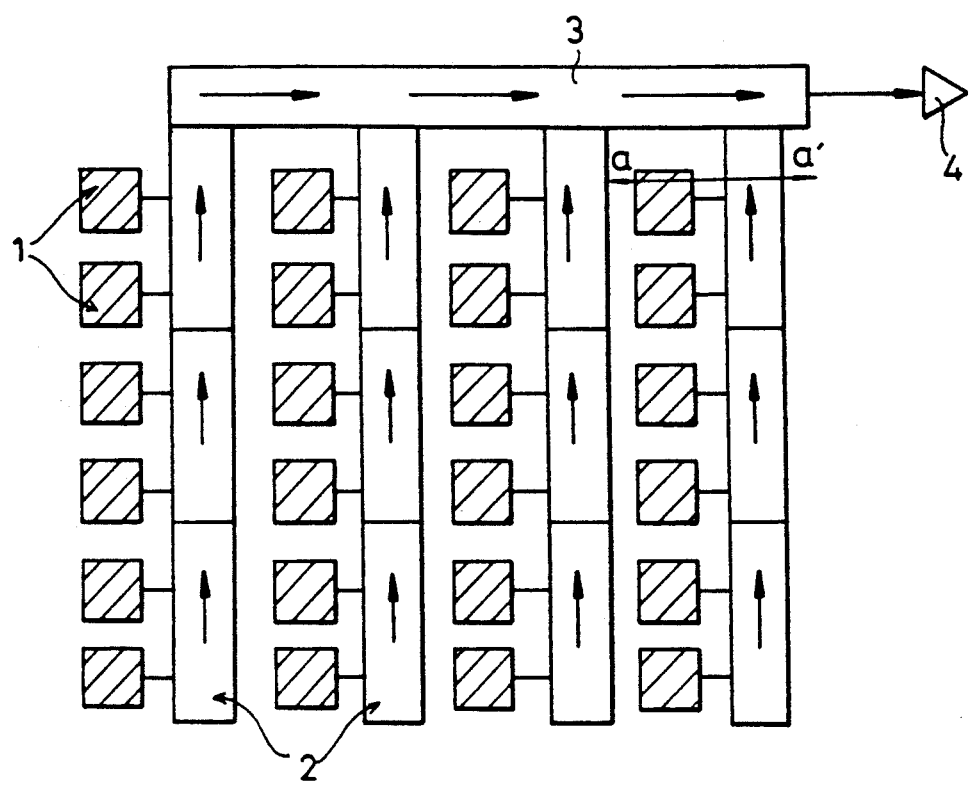
FIG. 1 is a schematic diagram of a construction of a conventional CCD image sensor of an interline transfer type.
Figure 2:
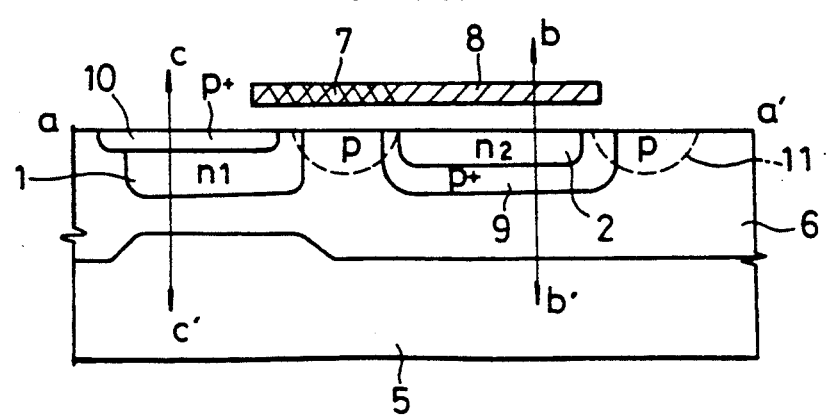
FIG. 2 is a sectional view, taken on the line a—a' of FIG. 1.
Figure 3:
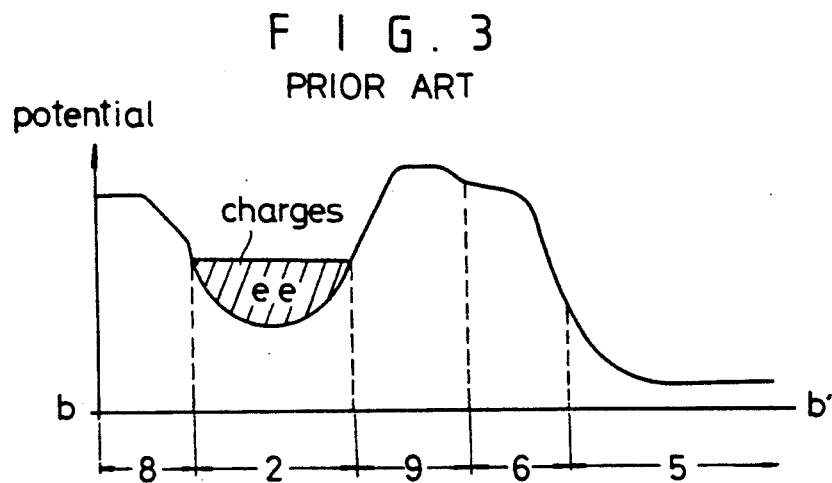
FIG. 3 is a potential profile diagram, taken on the line b—b' of FIG. 2.
Figure 4:
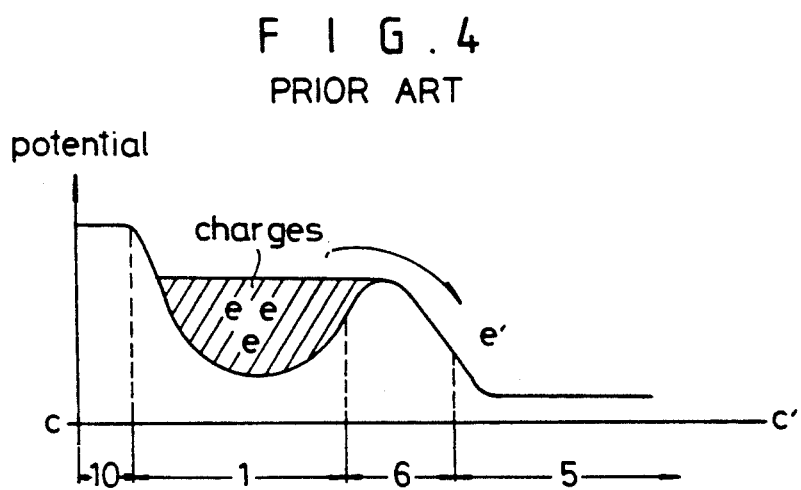
FIG. 4 is a potential profile diagram, taken on the line c—c' of FIG. 2.

The P type ion layer 19 is adapted to prevent noises such as a blooming which can occur when the excess electronic signal charges resulting from a smear are transferred to the N type VCCD region 16, as stated previously with reference to FIG. 2. Also, the N type ion layer 20 absorbs the excess signal charges which the P type ion layer 19 fails to prevent from being transferred to the N type VCCD region 16 and prevents the excess signal charges from being transferred to the N type VCCD region 16. In result, the N type ion layer 20 prevents an overflow drain.

Also, on the surface of the N type photodiode 15 is formed a thin P+ type ion layer 21 for application of an initial bias to the surface.

Preferably, the materials of the transfer gate electrode 17 and the gate electrode 18 may be polysilicons. Although not shown, insulating films are formed between the transfer gate electrode 17, the gate electrode 18 and the surface of the P type well 14.

Now, the operation of the CCD image sensor with the above-mentioned construction in accordance with the present invention will be described in detail with reference to FIGS. 6 through 8.

Figure 6:
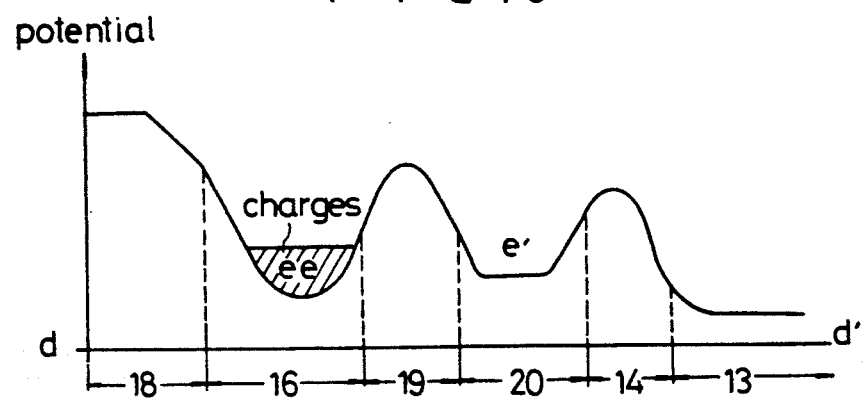
FIG. 6 is a potential profile diagram, taken on the line d—d' of FIG. 5.

With reference to FIG. 6, there is shown a potential profile diagram, taken on the line d—d' of FIG. 5, illustrating a vertical potential distribution under the condition that the charges e are contained in the N type VCCD region 16.

Upon application of a high voltage to the transfer gate electrode 17, the image signal charges e are moved from the N type photodiodes 15 to the N type VCCD region 16. At this time, the excess charges resulting from a smear are not moved to the N type VCCD region 16, but are captured by the N type ion layer 20. The N type layer may also have a charge concentration lower than that of the N type photodetecting region and the N type VCCD region and higher than that of the N type substrate.

As shown in FIG. 5, a shutter voltage Vst is typically applied to the substrate, but, in accordance with the preferred embodiment of the present invention, may also be applied to the N type ion layer 20. Thus, in the preferred embodiment, the N type layer includes an electrode formed thereon. The period of time wherein the shutter voltage is applied is determined within the range of 1/60 to 1/2000 sec., being typically shortened to prevent the generation of the excess signal charges e' by the entrance of too much light.

Figure 7:
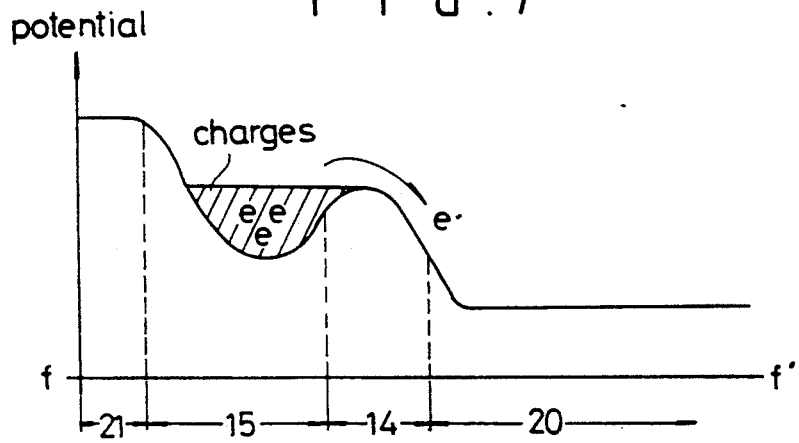
FIG. 7 is a potential profile diagram, taken on the line f—f' of FIG. 5.

With reference to FIG. 7, there is shown a potential profile diagram, taken on the line f—f' of FIG. 5, illustrating a state that the P type well 14 is fully depleted due to physical properties of the PN junction upon the application of a high voltage to the N type substrate 13, resulting in the lower potential barrier.

If strong light energy is transmitted to the N type photodiode 15, such that the signal charges from the N type photodiode 15 are too high, the excess signal charges e' are transferred to the N type ion layer 20 over the lower P type well 14. In result, since the N type ion layer 20 prevents the overflow drain, the portion of the P type well 14 between the N type photodiode 15 and the N type substrate 13 is not limited in its concentration and depth. In addition, a plane N type substrate may be used. The P type layer may have a charge concentration higher than that of the P type well.

Figure 8:
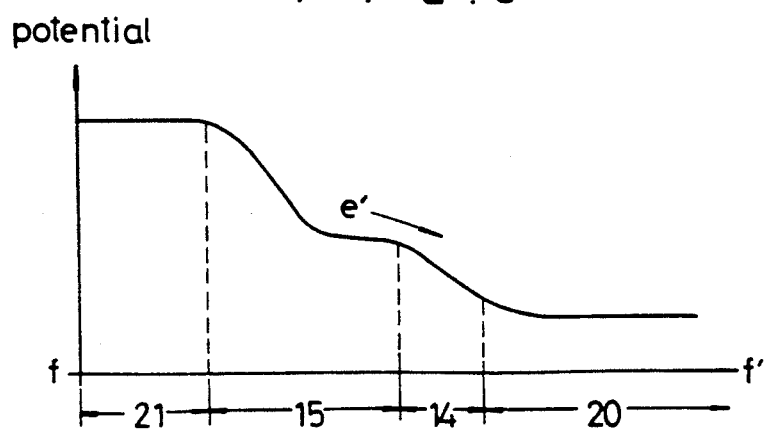
FIG. 8 is a potential profile diagram, taken on the line f—f' of FIG. 5, upon application of a shutter voltage.

With reference to FIG. 8, there is shown a potential profile diagram, taken on the line f—f' of FIG. 5, upon application of the shutter voltage. As shown in this figure, when the shutter voltage is applied to the N type ion layer 20, since the potential barrier of the P type well 14 is still lower than that of the N type ion layer 20, the excess signal charges are fully transferred to the N type substrate 13. In other words, by applying the shutter voltage Vst to the N type ion layer 20, the image signal charges of the red color type of long wavelength are prevented from being transferred to the N type substrate 13. Therefore, the photoelectric efficiency can be increased in a wavelength of the red color type wherein the amount of light energy is small. In addition, the concentration of the P type well may be varied to prevent the overflow drain, regardless of the photoelectric efficiency of the red color type. The P type layer may have a charge concentration higher than that of the P type well.

As hereinbefore described, the CCD image sensor according to the present invention can provide advantages as follows:

First, the N type ion layer can absorb the excess charges resulting from a smear, so that the excess charges from the P type well are not transferred to the N type VCCD region, resulting in the prevention of occurrence of noises.

Second, there is no necessity for restricting the concentration and depth of the P type well for the purpose of increasing the photoelectric efficiency of the red color type, resulting in convenience in design of the device.

Third, the application of the shutter voltage to the N type ion layer has an effect of increasing the photoelectric efficiency of the red color type.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A CCD image sensor having an N type photodetecting region, an N type VCCD region and an N type HCCD region, comprising:
   (a) a P type layer formed underneath and surrounding said N type VCCD region;
   (b) an N type layer formed underneath and surrounding said P type layer;
   (c) a P type well formed underneath and surrounding said N type layer and extending between the N type layer and the N type photodetecting region to electrically isolate the N type layer from the N type photodetecting region; and
   (d) an N type substrate formed under said P type well.

2. A CCD image sensor according to claim 1, wherein said substrate is adapted and arranged for receiving a shutter voltage.

3. A CCD image sensor as set forth in claim 1, wherein said N type layer includes an electrode formed thereon, for receiving a shutter voltage.

4. A CCD image sensor as set forth in claim 1, wherein said P type layer has a charge concentration higher than that of said P type well.

5. A CCD image sensor as set forth in claim 1, wherein said N type layer has a charge concentration lower than those of said N type photodetecting region and said N type VCCD region and higher than that of said N type substrate.

6. In a CCD image sensor having an N type photodetecting region, an N type VCCD region and an N type HCCD region, comprising:
   (a) a P type ion layer formed underneath and surrounding an N type VCCD region;
   (b) a P type well formed underneath and surrounding said P type layer; and
   (c) an N type substrate formed under said P type well; the improvement comprising:
   (d) an N type layer additionally interposed between said P type layer and said P type well, such that said N type layer is formed underneath and surrounding said P type layer, is separated from the N type photodetecting region by the P type well, and is electrically isolated from the N type photodetecting region by the P type well.

7. A CCD image sensor according to claim 6, wherein said substrate is adapted and arranged for receiving a shutter voltage.

8. A CCD image sensor according to claim 6, wherein said N type layer includes an electrode formed therein, for receiving a shutter voltage.

9. A CCD image sensor according to claim 6, wherein the P type layer has a charge concentration higher than that of the P type well.

10. A CCD image sensor according to claim 6, wherein said N type layer has a charge concentration lower than those of said N type photodetecting region and said N type VCCD region and higher than that of said N type substrate.

11. A CCD image sensor having an N type photodetecting region, an N type VCCD region and an N type HCCD region, comprising:
   (a) a P type layer formed underneath and surrounding said N type VCCD region;
   (b) an N type layer formed underneath and surrounding said P type layer, said N type layer including an electrode formed thereon, for receiving a shutter voltage;
   (c) a P type well formed underneath and surrounding said N type layer; and
   (d) an N type substrate formed under said P type well.

12. In a CCD image sensor having an N type photodetecting region, an N type VCCD region and an N type HCCD region, comprising:
   (a) a P type ion layer formed underneath and surrounding an N type VCCD region;
   (b) a P type well formed underneath and surrounding said P type layer; and
   (c) an N type substrate formed under said P type well; the improvement comprising:
   (d) an N type layer additionally interposed between said P type layer and said P type well, such that said N type layer is formed underneath and surrounding said P type layer, said N type layer including an electrode formed therein, for receiving a shutter voltage.

* * * * *

UNITED STATES PATENT AND TRADEMARK OFFICE
CERTIFICATE OF CORRECTION

| | |
|---|---|
| PATENT NO. | : 5,233,429 |
| APPLICATION NO. | : 07/775306 |
| DATED | : August 3, 1993 |
| INVENTOR(S) | : Hun J. Jung |

It is certified that error appears in the above-identified patent and that said Letters Patent is hereby corrected as shown below:

Title Page should read
[30] Foreign Application Priority Data
   Oct. 13, 1990 [KR]  Rep. of Korea ......................16259/1990

Signed and Sealed this

Twenty-first Day of April, 2009

JOHN DOLL
*Acting Director of the United States Patent and Trademark Office*